(12) United States Patent
Murakami et al.

(10) Patent No.: US 8,323,880 B2
(45) Date of Patent: Dec. 4, 2012

(54) POSITIVE RESIST PROCESSING LIQUID COMPOSITION AND LIQUID DEVELOPER

(75) Inventors: Yutaka Murakami, Saitama (JP); Norio Ishikawa, Saitama (JP); Taku Murata, Kanagawa (JP); Kenji Saito, Kanagawa (JP); Ryosuke Araki, Kanagawa (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 182 days.

(21) Appl. No.: 12/310,054

(22) PCT Filed: Aug. 10, 2007

(86) PCT No.: PCT/JP2007/065689
§ 371 (c)(1),
(2), (4) Date: Oct. 8, 2009

(87) PCT Pub. No.: WO2008/018580
PCT Pub. Date: Feb. 14, 2008

(65) Prior Publication Data
US 2010/0086882 A1  Apr. 8, 2010

(30) Foreign Application Priority Data
Aug. 10, 2006 (JP) .................... 2006-218695

(51) Int. Cl.
G03F 7/26 (2006.01)
(52) U.S. Cl. ........................ 430/327; 430/322
(58) Field of Classification Search .............. 430/331, 430/322, 326, 327; 510/175
See application file for complete search history.

(56) References Cited

U.S. PATENT DOCUMENTS

| | | | |
|---|---|---|---|
| 4,324,879 A * | 4/1982 | Bock et al. | 528/45 |
| 4,628,023 A * | 12/1986 | Cawston et al. | 430/331 |
| 6,824,446 B1 * | 11/2004 | Ang et al. | 451/6 |
| 2004/0185751 A1 | 9/2004 | Nakanishi et al. | |
| 2005/0221615 A1 | 10/2005 | Toyota et al. | |
| 2005/0245422 A1 | 11/2005 | Yamada et al. | |
| 2007/0135651 A1 * | 6/2007 | Dubois et al. | 554/56 |
| 2007/0167343 A1 | 7/2007 | Suzuki et al. | |
| 2009/0130606 A1 * | 5/2009 | Omae et al. | 430/323 |

FOREIGN PATENT DOCUMENTS

| | | | |
|---|---|---|---|
| GB | 459309 | | 7/1936 |
| JP | 63-006548 A | | 1/1988 |
| JP | 64-072155 A | | 3/1989 |
| JP | 01-129250 A | | 5/1989 |
| JP | 09-106081 A | | 4/1997 |
| JP | 09-212922 A | | 8/1997 |
| JP | 2004-241434 A | | 8/2004 |
| JP | 2005-277050 A | | 10/2005 |
| JP | 2005-336470 A | | 12/2005 |
| WO | WO 2005/089927 | * | 9/2005 |
| WO | WO 2006/025373 A1 | | 3/2006 |
| WO | WO 2006/070095 A1 | | 7/2006 |
| WO | WO 2006/134902 | * | 12/2006 |

OTHER PUBLICATIONS

Bunton, C.A. et al., Dephosphorylation and Aromatic Nucleophilic Substitution in an Alkoxide Functionalized Micelle, *Journal of Physical Chemistry* 1983; 87:5491-5498.

* cited by examiner

*Primary Examiner* — Anca Eoff
(74) *Attorney, Agent, or Firm* — Wolf, Greenfield & Sacks, P.C.

(57) ABSTRACT

Disclosed is a positive resist processing liquid composition which is composed of an aqueous solution containing a quaternary ammonium hydroxide represented by the following general formula (I).

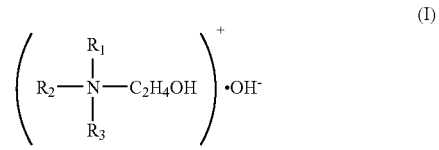

In the formula, $R_1$ and $R_3$ independently represent a methyl group, and $R_2$ represents an alkyl group having 12-18 carbon atoms.

4 Claims, No Drawings

POSITIVE RESIST PROCESSING LIQUID COMPOSITION AND LIQUID DEVELOPER

RELATED APPLICATIONS

This application is a national stage filing under 35 U.S.C. § 371 of PCT International application PCT/JP2007/065689, filed Aug. 10, 2007.

TECHNICAL FIELD

The present invention relates to a positive resist process liquid composition that prevents contaminant sources such as polishing scraps from adhering on the positive resist surface that is a surface protection film of a wafer in the manufacturing process in which polishing of the periphery of a semiconductor substrate is carried out, and to a developer for a positive resist that prevents a resist pattern from being destroyed at the time of rinsing and drying in the development process.

BACKGROUND ART

In a manufacturing process of a semiconductor device, there is a step in which a peripheral part of a substrate of a semiconductor wafer etc. is polished (for example, see Patent document 1). This step is the step in which, needle-shaped projections, which are formed by adhesion of by-products formed during etching on the bevel part and edge part of the Si wafer and further interacting with a mask of the etching in RIE (Reactive Ion Etching) step to form a trench (deep trench) of a trench capacitor on the surface of an Si wafer, are polished and removed by a polishing tape provided with polishing abrasive grain etc. The needle-shaped projections must be removed as the projections broken at the time of transporting of the wafer etc. cause dusting, which leads to decrease in yield.

Methods for preventing fragments of wafer and particles derived from the abrasive grains in the polishing tape from dispersing and adhering onto the wafer surface at the time of polishing in the above-described process include the method in which a surface protection film of the positive resist etc. is formed in advance, and further pure water is supplied over the wafer during polishing to cover the positive resist surface with water, etc. However, there has been a problem that since the resist film consisting of resin, etc. shows hydrophobicity, water cannot cover the whole positive resist surface, and these particles adhere strongly onto the resist surface, which can hardly be removed even if the surface after polishing is cleaned physically.

Measures for this include a method for increasing the affinity between the resist film and water by imparting hydrophilicity to the positive resist surface employing a certain means. As the hydrophilization processing of the positive resist surface, though the method by plasma processing is known generally, this method has the problem that it needs to introduce an equipment for plasma processing, which leads to increase of the cost.

As another hydrophilization processing method of the positive resist film, for example, Patent document 2 discloses a method for increasing hydrophilicity wherein —OH group is provided by dropping pure water onto the positive resist surface for 5 minutes or more in the method for manufacturing an optical disc. However, this method has the problem that the hydrophilization processing is time-consuming, therefore the throughput is decreased.

Further, in the method for forming a resist pattern, for example, Patent document 3 discloses the method for increasing hydrophilicity in which TMAH (tetramethylammonium hydroxide), diethyl ethanolamine aqueous solution etc. are used as hydrophilization process agents which have an excellent wettability of a developer, and these hydrophilization process agents are supplied onto the positive resist surface for several minutes. However, this method also has the problem that the hydrophilization processing is time-consuming, therefore the throughput is decreased.

Further, Patent document 4 discloses the method for preventing particles from adhering onto the substrate surface in which, when polishing the periphery of a substrate to be processed, a coating of a surfactant or a water-soluble polymer agent is provided on the substrate surface by supplying a surfactant or a water-soluble polymer agent on the substrate surface in advance. However, in this method, since the surfactant and the water-soluble polymer is removed by supplying pure water onto the substrate surface, which leads to loss of the coating effect, it is necessary to supply the surfactant continuously or intermittently during polish processing, and a large amount of process liquid is thus necessary, which is not economical.

Though hydrophilization of the positive resist surface can be accomplished by slightly dissolving the surface with a common organic alkali solution such as TMAH, choline etc., in the technique wherein a process liquid is coated on the wafer surface while spinning the wafer by using a single-wafer apparatus, and the process liquid is extended to the whole wafer surface using the centrifugal force generated by spinning, there is a problem that hydrophilization is insufficient as the process liquid is not expanded uniformly to the whole wafer surface, because the above-described organic alkali solution has a high surface tension, therefore a large amount of the process liquid is necessary, and the solution shows inferior wet and expand properties. These problems are especially significant in the case of hydrophilizing the whole positive resist surface on the large-sized wafer of, such as, 200 mm, 300 mm, etc.

Moreover, in the manufacturing process of a semiconductor device, a problem is concerned that the pattern is destroyed by the interface tension between a positive resist pattern and a rinse liquid (for example, water) at the time of rinsing and drying in the development process with advancement of nano-patterning and higher aspect ratio.

Patent document 1: JP, A, 2004-241434
Patent document 2: JP, A, 9-212922
Patent document 3: JP, A, 9-106081
Patent document 4: JP, A, 2005-277050

DISCLOSURE OF INVENTION

Problems to be Solved by the Invention

It is the object of the present invention to provide a process liquid composition capable of imparting hydrophilicity to the whole positive resist surface uniformly, in particular a process liquid composition that can prevent particles from adhering onto the positive resist surface only by supplying pure water or a polishing liquid during polishing by maintaining hydrophilicity, and can contribute to increase of throughput by rapidly imparting and maintaining hydrophilicity to a positive resist surface that is a surface protection film in the manufacturing process for polishing the periphery of a semiconductor substrate, and a process liquid composition that can hydrophilize the substrate surface uniformly with a small amount of liquid.

Further, it is another object of the present invention to provide a developer that can reduce the interface tension between the positive resist and water at the time of rinsing and drying, and prevent the resist pattern from being destroyed by hydrophilizing the positive resist surface at the time of development.

Means for Solving the Problems

As a result of intensive research for finding a process liquid composition that can solve the above-described problems, the present inventors have found that the process liquid composition comprising quaternary ammonium hydroxide having an alkyl group with 12 to 18 carbon atoms and a hydroxyethyl group has an excellent surface tension reducing ability, and as a result of a further research, completed the present invention.

That is, the present invention relates to a positive resist process liquid composition consisting of an aqueous solution comprising quaternary ammonium hydroxide represented by the following general formula (I):

[Chem. 1]

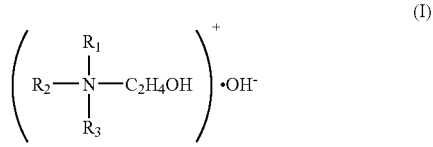

wherein $R_1$ and $R_3$ each represent a methyl group, $R_2$ represents an alkyl group with 12 to 18 carbon atoms.

Also, the present invention relates to a positive resist surface processing method, wherein the positive resist surface is processed using the above-described positive resist process liquid composition.

Further, the present invention relates to the positive resist surface processing method, wherein the positive resist surface is processed using the above-described positive resist process liquid composition in advance when the periphery of a semiconductor substrate is polished.

Also, the present invention relates to the positive resist surface processing method, wherein processing is carried out by spray atomization method, dropping method or immersion method.

Further, the present invention relates to a developer for a positive resist, consisting of an aqueous solution comprising quaternary ammonium hydroxide represented by the above general formula (I).

The positive resist process liquid composition of the present invention has an excellent surface tension reducing ability, and can be coated onto a substrate uniformly with a small amount of a process liquid composition, by comprising quaternary ammonium hydroxide having an alkyl group with 12 to carbon atoms and a hydroxyethyl group. Also, because permeability against a resist is increased, it is possible to dissolve the positive resist surface within a short time in the range of tens to hundreds of angstroms in thickness, thereby facilitating hydrophilization. Further, in case of being processed by the positive resist process liquid composition of the present invention, once hydrophilized, the effect is maintained, so that the coating effect is not lost by supplying pure water and polishing liquid onto the substrate surface.

The term "hydrophilization" used in the present specification means to impart hydrophilicity to a resist surface, and hydrophilization can be evaluated by a so-called wettability. For example, it can be evaluated by whether water on the resist surface is shed (hydrophobic) or the whole resist surface remains in the wet condition (hydrophilic) after pure water is supplied onto the substrate surface.

The positive resist process liquid composition of the present invention exerts the above-described excellent effect by comprising quaternary ammonium hydroxide represented by the above general formula (I). Also, for example, since it has a low surface tension unlike TMAH and choline (all of $R_1$ to $R_3$ in the general formula (I) represent methyl groups), the amount of the necessary process liquid composition is smaller than these organic alkalis, and since it has a weak alkali property, it does not damage the substrate (resist).

Moreover, the present inventors have found that, in the case the compounds represented by the general formula (I) wherein $R_2$ is an alkyl group with 8 carbon atoms, the process liquid composition comprising such quaternary ammonium hydroxide shows little hydrophilization action.

The developer for a positive resist of the present invention reduces the interface tension between the positive resist and rinse liquid (for example, water) at the time of rinsing and drying by hydrophilizing the positive resist surface, thereby preventing destruction of the resist pattern.

Also, the developer of the present invention imparts wettability to the resist surface, so that the developer covers the whole substrate surface, and also has the suppressing effect on occurrence of uneven development.

Effects of the Invention

According to the process liquid composition of the present invention, in the manufacturing process in which the periphery (bevel part, edge part, notch part, etc.) of the semiconductor substrate is polished, the particles can be prevented from adhering onto the positive resist surface only by supplying pure water during polishing, which can contribute to increase of throughput, because hydrophilicity can rapidly be imparted to the positive resist surface that is a surface protection film, and the imparted hydrophilicity is maintained. Also, the amount of the process liquid composition used for hydrophilization of the positive resist surface can be reduced, and at the same time it can be coated on the substrate uniformly, because the surface tension of the process liquid composition is low. Also, according to the developer for the positive resist of the present invention, destruction of the resist pattern at the time of drying can be prevented, because the resist surface is hydrophilized in accordance with development of the positive resist.

BEST MODE FOR CARRYING OUT THE INVENTION

The process liquid composition of the present invention is the process liquid capable of imparting hydrophilicity to a positive resist surface, and comprises quaternary ammonium hydroxide having a methyl group, an alkyl group with 12 to 18 carbon atoms and a hydroxyethyl group, represented by the following general formula (I).

[Chem. 2]

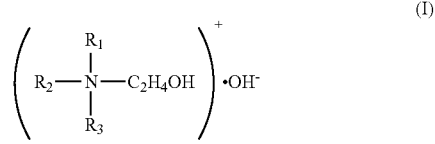

In the formula, $R_1$ and $R_3$ each represent a methyl group, $R_2$ represents an alkyl group with 12 to 18 carbon atoms. $R_2$ can be either straight chain or branched chain, preferably a straight chain alkyl group.

As preferable quaternary ammonium hydroxides represented by the general formula (I), 2-hydroxyethyl-(N,N-dimethyl-N-lauryl)ammonium hydroxide represented by the following formula (Ia), 2-hydroxyethyl-(N,N-dimethyl-N-myristyl)ammonium hydroxide represented by the formula (Ib), 2-hydroxyethyl-(N,N-dimethyl-N-stearyl)ammonium hydroxide represented by the formula (Ic), etc. are exemplified. Quaternary ammonium hydroxides represented by the general formula (I) may be used alone or two or more may be used in combination.

[Chem. 3]

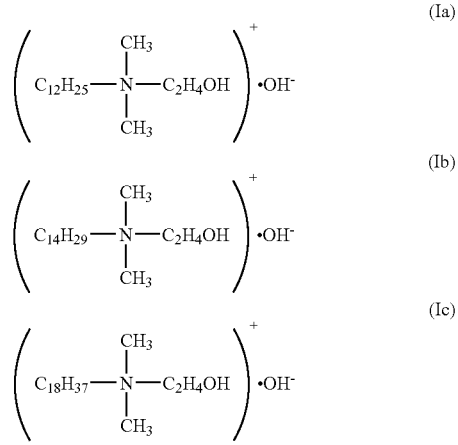

The concentration of quaternary ammonium hydroxide in the process liquid composition is preferably 0.01 to 10% by mass, particularly preferably 0.5 to 5% by mass. If the concentration of quaternary ammonium hydroxide is low, hydrophilization may be insufficient and processing for a long time may be necessary in order to impart sufficient hydrophilicity, and if the concentration of quaternary ammonium hydroxide is high, damage against resist becomes large. As the preferable concentration of quaternary ammonium hydroxide varies depending on the resist type, it is preferable to properly adjust the concentration of quaternary ammonium hydroxide in the process liquid composition in accordance with the resist type.

The process liquid composition of the present invention may comprise other ingredients other than the above-described quaternary ammonium hydroxides to the extent that the object of the present invention is not interfered. As other ingredients, anionic surfactants (polycarboxylic acids, polyacrylic acids, alkylbenzene sulfonic acids, etc.), cationic surfactants (quaternary ammonium salts, such as alkyl trimethylammonium chloride, alkyl pyridinium chloride, etc.), water-soluble polymeric agents [celluloses (methyl cellulose, methyl hydroxyethyl cellulose, methyl hydroxypropyl cellulose, hydroxyethyl cellulose, hydroxypropyl cellulose, carboxymethyl cellulose, carboxyethyl cellulose, carboxymethyl hydroxyethyl cellulose, etc.), chitosans, etc.], nonionic surfactants (acetylene diols, polyoxyalkylene alkyl ether, polyoxyethylene alkylamine, polyvinyl pyrrolidone etc.) etc., organic alkalis [TMAH, diethyl ethanolamine, etc.], alcohols [methanol, ethanol, isopropyl alcohol, etc.] etc. are exemplified.

As processing method using the process liquid composition of the present invention, various methods for contacting the process liquid composition onto the resist surface are exemplified, such as (1) spray atomization method, (2) dropping method, (3) immersion method, etc. For example, in the case of (1) spray atomization method or (2) dropping method, the process liquid composition is sprayed or dropped from a nozzle located over a substrate to be processed while spinning the substrate to be processed using a single-wafer apparatus, etc., and coated so that the process liquid composition is spread over the whole positive resist area of the surface of the substrate to be processed. In (3) immersion method, a substrate to be processed is immersed so that the whole positive resist are of the surface of the substrate to be processed is immersed with the process liquid composition. The processing time for hydrophilization is, in any method, preferably 5 seconds to 60 seconds, particularly preferably 10 seconds to 30 seconds. If the processing time is short, hydrophilization is insufficient, and if the processing time is excessively long, damage against the resist becomes large. In (2) dropping method, it is generally known that the amount of the process liquid composition necessary for covering the whole wafer surface is smaller in the case of the process liquid composition with low surface tension than in the case of the process liquid composition with high surface tension. Therefore, for the process liquid composition of the present invention with low surface tension, the supplying amount of the process liquid composition can be reduced as compared to organic alkalis, such as TMAH, choline, etc. with high surface tension.

The developer for a positive resist of the present invention comprises quaternary ammonium hydroxide represented by the above general formula (I). Preferred examples of the quaternary ammonium hydroxides used for the developer and the content of the quaternary ammonium hydroxides in the developer are similar to those of the positive resist process liquid composition.

The developer for a positive resist of the present invention can comprise, as other ingredients other than quaternary ammonium hydroxides represented by the general formula (I), ingredients usually added to a developer, such as inorganic alkalis (sodium hydroxide, potassium hydroxide, sodium carbonate, sodium silicate, sodium metasilicate, ammonia water, etc.), primary amines (ethylamine, n-propylamine, etc.), secondary amines (diethylamine, di-n-butylamine, etc.), tertiary amines (triethylamine, methyl diethylamine, etc.), alcohol amines (dimethyl ethanolamine, triethanolamine, etc.), quaternary ammonium salts (tetramethyl ammonium hydroxide, tetraethyl ammonium hydroxide, etc.), cyclic amines (pyrrole, piperidine, etc.), alcohols, surfactants.

In general, in the manufacturing process of a semiconductor device, a resist pattern is obtained by exposing a substrate in which a resist film is formed through a given mask, and baking, developing, rinsing and drying. In developing process, developing and rinse processing can be carried out by spray atomization method, dropping method, immersion method etc. similarly to the processing method by the above-described process liquid composition. For example, in case of processing using a single-wafer apparatus, the substrate is processed by supplying a developer and a rinsing liquid onto the surface of the substrate to be processed from a developer nozzle and rinsing liquid nozzle located over the substrate to be processed while spinning the substrate to be processed.

The positive resist to which the process liquid composition of the present invention or the developer of the present invention is applied is not limited specifically, for example, positive resist using novolac resin, polyacrylic acid, poly-p-hydroxy styrene, polynorbornene resin, resins in which fluorine is introduced thereto, etc. as materials is exemplified.

EXAMPLES

The present invention is explained below in detail by means of examples, but the present invention is not limited to these examples.

A positive resist [820, manufactured by Nagase & Co., Ltd., film thickness of approximately 17,000 angstroms] was spin coated onto a silicon wafer, which was thereafter baked at 120° C. for 10 minutes for the purpose of removing a solvent and increasing adhesion with the substrate. A process liquid composition was prepared with each ingredient shown in Table 1 dissolved respectively in pure water so as to be the composition shown in Table. A silicon wafer to which the above-described positive resist film was formed as a test piece was immersed in each process liquid composition at 25° C. for 10 seconds without stirring, which was then rinsed with running super pure water for 3 minutes. After rinsing, the test piece was drawn up, and wettability of the resist surface was observed visually. Also, the decreased amount of the film thickness before and after processing was measured by means of an optical interferometric film thickness meter, and damage to the resist was evaluated. The results are shown in Table 1.

As shown in Comparative examples 1 to 4, the solution comprising TMAH imparted hydrophilicity at 1.5% by mass or more of TMAH, whereas the solution comprising 2-hydroxyethyl-(N,N-dimethyl-N-lauryl)ammonium hydroxide (Compound 1) shown in Examples 1 to 4 imparted good hydrophilicity at 0.5% by mass of Compound 1, and the decreased amount of the resist film was small. Further, also the solution comprising 2-hydroxyethyl-(N,N-dimethyl-N-myristyl)ammonium hydroxide (Compound 2) or 2-hydroxyethyl-(N,N-dimethyl-N-stearyl)ammonium hydroxide (Compound 3) shown in Examples 5 to 7 imparted hydrophilicity as well, and the decreased amount of the resist film at the time of imparting hydrophilicity was small. On the other hand, as shown in Comparative example 5 and Comparative example 6, the process liquid compositions described in Patent document 2 and Patent document 3 using pure water dropping and diethanolamine did not show hydrophilization.

TABLE 1

| Example No. | Ingredient | % by mass | Resist surface wettability | Decreased amount of resist film thickness (angstroms) |
|---|---|---|---|---|
| Example 1 | Compound 1 | 2.0 | ○ | 79 |
| Example 2 | Compound 1 | 1.5 | ○ | 57 |
| Example 3 | Compound 1 | 1.0 | ○ | 36 |
| Example 4 | Compound 1 | 0.5 | ○ | 18 |
| Example 5 | Compound 2 | 2.0 | ○ | 89 |
| Example 6 | Compound 2 | 1.0 | ○ | 60 |
| Example 7 | Compound 3 | 2.0 | ○ | 41 |
| Comparative example 1 | TMAH | 2.0 | ○ | 762 |
| Comparative example 2 | TMAH | 1.5 | ○ | 150 |
| Comparative example 3 | TMAH | 1.0 | X | 18 |
| Comparative example 4 | TMAH | 0.5 | X | 1 |
| Comparative example 5 | Pure water dropping | — | X | — |
| Comparative example 6 | Diethyl ethanolamine | 5.0 | X | — |

Evaluation criteria of wettability of the resist surface:
X: Hydrophobic (When a test piece is drawn up after rinsing with running water, water is shed immediately or gradually)
○: Hydrophilic (The condition that the whole resist surface remains wet)
TMAH: Tetramethylammonium hydroxide
Compound 1: 2-Hydroxyethyl-(N,N-dimethyl-N-lauryl)ammonium hydroxide
Compound 2: 2-Hydroxyethyl-(N,N-dimethyl-N-myristyl)ammonium hydroxide
Compound 3: 2-Hydroxyethyl-(N,N-dimethyl-N-stearyl)ammonium hydroxide An evaluation test similar to the one given to Table 1 was carried out using a silicon wafer on which a positive resist film [OFPR-800, manufactured by Tokyo Ohka Kogyo Co., Ltd., film thickness of approximately 18,000 angstroms] was formed as a test piece. The results are shown in Table 2. As shown in Comparative examples 7 to 10, the solution comprising TMAH imparted hydrophilicity at 2.0% by mass of TMAH, whereas the solution comprising 2-hydroxyethyl-(N,N-dimethyl-N-lauryl)ammonium hydroxide (Compound 1) shown in Examples 8 to 9 imparted hydrophilicity at 1.0% by mass of Compound 1, and the decreased amount of the resist film was small. Further, also the solution comprising 2-hydroxyethyl-(N,N-dimethyl-N-myristyl)ammonium hydroxide (Compound 2) shown in Example 10 imparted hydrophilicity as well, and the decreased amount of the resist film at the time of imparting hydrophilicity was small. Further, as shown in Comparative example 11 and Comparative example 12, in the process liquids described in Patent document 2 and Patent document 3, hydrophilization was not shown.

TABLE 2

| Example No. | Ingredient | % by mass | Resist surface wettability | Decreased amount of resist film thickness (angstroms) |
|---|---|---|---|---|
| Example 8 | Compound 1 | 1.5 | ○ | 89 |
| Example 9 | Compound 1 | 1.0 | ○ | 41 |
| Example 10 | Compound 2 | 2.0 | ○ | 61 |
| Comparative example 7 | TMAH | 2.5 | ○ | 396 |
| Comparative example 8 | TMAH | 2.0 | ○ | 111 |
| Comparative example 9 | TMAH | 1.5 | X | 63 |
| Comparative example 10 | TMAH | 1.0 | X | 17 |
| Comparative example 11 | Pure water dropping | — | X | — |
| Comparative example 12 | Diethyl ethanolamine | 5.0 | X | — |

[Evaluation criteria of the resist surface wettability]
X: Hydrophobic (When a test piece is drawn up after rinsing with running water, water is shed immediately or gradually)
○: Hydrophilic (The condition that the whole resist surface remains wet)
TMAH: Tetramethylammonium hydroxide
Compound 1: 2-Hydroxyethyl-(N,N-dimethyl-N-lauryl)ammonium hydroxide
Compound 2: 2-Hydroxyethyl-(N,N-dimethyl-N-myristyl)ammonium hydroxide Using a 300 mm silicon wafer on which a positive resist used in the evaluation shown in Table 2 (film thickness of approximately 11,000 angstroms) was formed, the amount of the process liquid composition necessary for the process liquid composition to cover the whole resist surface of the wafer in the method wherein a process liquid composition was dropped onto a wafer to hydrophilize using a single-wafer apparatus was examined. The results are shown in Table 3. As shown in Example 11 and Comparative example 13, it is clear that, the amount necessary for covering the whole resist surface is smaller for the process liquid composition of the present invention than the process liquid composition comprising TMAH.

TABLE 3

| Example No. | Ingredient | % by mass | The amount necessary for covering the whole resist surface (ml) |
|---|---|---|---|
| Example 11 | Compound 1 | 0.5 | 115 |
| Comparative example 13 | TMAH | 2.5 | 189 |

TMAH: Tetramethyl ammonium hydroxide
Compound 1: 2-Hydroxyethyl-(N,N-dimethyl-N-lauryl)ammonium hydroxide

The invention claimed is:

1. A positive resist surface processing method for imparting hydrophilicity to the positive resist surface, comprising a step of processing the positive resist surface of a substrate on which a positive resist film is formed with a positive resist process aqueous solution composition, wherein the composition consists of water and quaternary ammonium hydroxide represented by the following general formula (I):

[Chem 2]

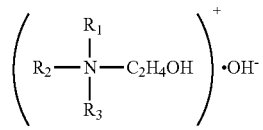

wherein $R_1$ and $R_3$ each represent a methyl group, and $R_2$ represents an alkyl group with 12 to 18 carbon atoms.

2. The positive resist surface processing method according to claim 1, wherein the positive resist surface is processed before the periphery of the substrate is polished.

3. The positive resist surface processing method according to claim 1, wherein processing is carried out by spray atomization method, dropping method or immersion method.

4. The positive resist surface processing method according to claim 2, wherein processing is carried out by spray atomization method, dropping method or immersion method.

* * * * *